United States Patent [19]

Long et al.

[11] Patent Number: 4,788,049

[45] Date of Patent: Nov. 29, 1988

[54] METHOD FOR CONTROLLING THE CRYSTAL MORPHOLOGY OF SILICON NITRIDE

[75] Inventors: Robert A. Long; Harrison Shallenberger, both of Towanda, Pa.; Dale E. Wittmer, Carbondale, Ill.

[73] Assignee: GTE Products Corporation, Stamford, Conn.

[21] Appl. No.: 842,597

[22] Filed: Mar. 21, 1986

[51] Int. Cl.$^4$ .................... C01B 21/063; C01B 33/06
[52] U.S. Cl. ..................................... 423/344; 423/406
[58] Field of Search ................................ 423/344, 406

[56] References Cited

U.S. PATENT DOCUMENTS 4,399,113 8/1983 Sato et al. ........................... 423/406
4,517,168 5/1985 Kawahito et al. .................. 423/344

FOREIGN PATENT DOCUMENTS 0095606 6/1983 Japan ................................... 423/344
0073412 4/1984 Japan ................................... 423/344
0195099 10/1985 Japan ................................... 423/344

Primary Examiner—John Doll
Assistant Examiner—Lori S. Freeman
Attorney, Agent, or Firm—Donald R. Castle; L. Rita Quatrini

[57] ABSTRACT

A method is disclosed for producing silicon nitride wherein the crystal morphology is controlled. The method involves heating a mixture consisting essentially of a chlorosilane and ammonia at a sufficient temperature for a sufficient time to produce a nitogen containing silane as an intermediate. The bulk density of the intermediate is controlled to less than about 0.1 g/cc to result in the silicon nitride having a crystal morphology which is essentially all fibrous, or the bulk density can be controlled to greater than about 0.3 g/cc to result in the silicon nitride having a crystal morphology which is essentially all equiaxial, or the bulk density can be controlled to between about 0.1 g/cc and about 0.3 g/cc to result in the silicon nitride having a crystal morphology which is a mixture of fibrous and equiaxial. The intermediate is then heated at a sufficient temperature for a sufficient time in a non-oxidizing atmosphere to produce the controlled crystal morphology silicon nitride.

9 Claims, 2 Drawing Sheets

SILICON NITRIDE PRODUCED FROM AN INTERMEDIATE
HAVING A BULK DENSITY OF ABOUT 0.07g/cc

SILICON NITRIDE PRODUCED FROM AN INTERMEDIATE
HAVING A BULK DENSITY OF ABOUT 0.19 g/cc

SILICON NITRIDE PRODUCED FROM AN INTERMEDIATE
HAVING A BULK DENSITY OF ABOUT 0.41 g/cc

METHOD FOR CONTROLLING THE CRYSTAL MORPHOLOGY OF SILICON NITRIDE

BACKGROUND

This invention relates to a method for controlling the crystal morphology of silicon nitride. More particularly, it relates to a method for controlling the crystal morphology of silicon nitride by controlling the bulk density of the intermediate product formed by reacting a chlorosilane with ammonia, with an increase in bulk density over about 0.1 g/cc resulting in at least a portion of the silicon nitride having equiaxed crystals.

Cross reference to copending application.

This invention is related to copending application Ser. No. 768,995 entitled "Production of Silicon Nitride," filed Aug. 26, 1985 and assigned to the same assignee as the present application. Application Ser. No. 768,995 relates to a method for producing silicon nitride by reacting a chlorosilane with a controlled amount of ammonia to produce an intermediate chloroimide reaction product which has a relatively low ammonium chloride content.

Silicon nitride has found use in a wide variety of applications such as wear parts, milling media, and heat engine components.

In certain applications such as slip casting and in composites it is desirable to have silicon nitride of fibrous crystal structure.

In certain applications such as dry pressing, isopressing, extrusion, and injection molding it is desirable to have silicon nitride of equiaxial crystal structure.

U.S. Pat. No. 4,387,079 describes controlling the crystal structure of silicon nitride by adjusting the calcination temperature in formation of the silicon nitride.

Japanese Pat. No. 0073412 discloses a process for synthesizing silicon nitride by reacting a silicon halide, such as silicon tetrachloride, with ammonia at 600°–1500° C. in a gas containing ammonia and subsequently heating in an inert gas. This reference does not teach controlling the bulk density of an intermediate to control the crystal morphology of the silicon nitride product.

SUMMARY OF THE INVENTION

In accordance with one aspect of this invention there is provided a method for producing silicon nitride wherein the crystal morphology is controlled. The method involves heating a mixture consisting essentially of a chlorosilane and ammonia at a sufficient temperature for a sufficient time to produce a nitrogen containing silane as an intermediate. The bulk density of the intermediate is controlled to less than about 0.1 g/cc to result in the silicon nitride having a crystal morphology which is essentially all fibrous, or the bulk density can be controlled to greater than about 0.3 g/cc to result in the silicon nitride having a crystal morphology which is essentially all equiaxial, or the bulk density can be controlled to between about 0.1 g/cc and about 0.3 g/cc to result in the silicon nitride having a crystal morphology which is a mixture of fibrous and equiaxial. The intermediate is then heated at a sufficient temperature for a sufficient time in a non-oxidizing atmosphere to produce the controlled crystal morphology silicon nitride.

DETAILED DESCRIPTION OF THE INVENTION

Figure 1:
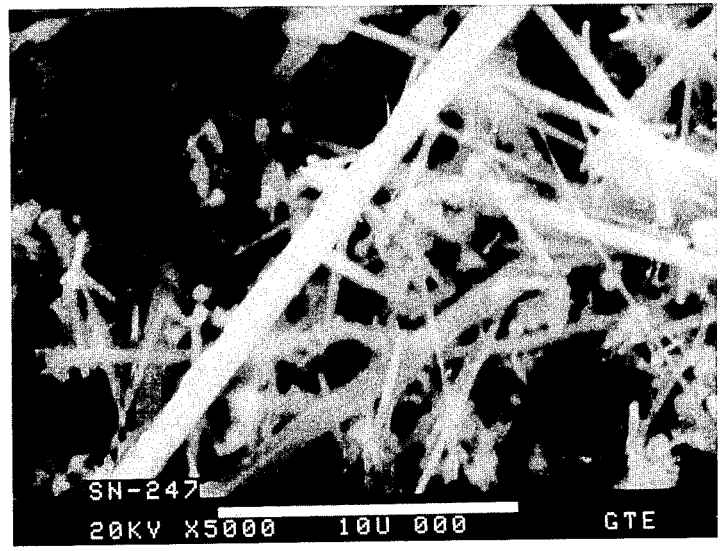
FIG. 1 is a photomicrograph of silicon nitride produced from an intermediate in which the bulk density is about 0.07 g/cc.

For a better understanding of the present invention, together with other and further objects, advantages and capabilities thereof, reference is made to the following disclosure and appended claims in connection with the above described figures and description of some of the aspects of the invention.

By the method of this invention, the bulk density of the intermediate product formed by the reaction of a chlorosilane with ammonia is controlled and results in the final silicon nitride having the desired crystal morphology.

A mixture of a chlorosilane which is preferably silicon tetrachloricde and ammonia is formed and heated at a sufficient temperature for a sufficient time to produce a nitrogen containing silane as an intermediate. By controlling the relative amounts of chlorosilane and ammonia, and by controlling the temperature and time of reaction the type of intermediate which is formed is controlled. For example, if the temperature is below about 250° C. silicon diimide forms. Preferably, the reaction conditions are controlled so that the intermediate is silicon chloroimide.

In accordance with the preferred embodiment, the first step is formation of a gaseous mixture consisting essentially of ammonia and a chlorosilane which is preferably silicon tetrachloride, at the temperature at which solid ammonium chloride does not form. This is preferably at least about 300° C., and most preferably from about 300° C. to about 700° C. In this temperature range the reaction is very slow thus allowing a relatively uniform essentially unreacted mixture to form.

The ammonia content of the mixture is controlled so that the mole ratio of ammonia to the chlorosilane is from about 0.60 to about 2.0, most preferably about 1. At mole ratios less than about 0.60, there is insufficient nitrogen available to react with the chlorosilane and therefore a portion of the chlorosilane is not converted to the chloroimide in the subsequent reaction, which is undesirable from an economic standpoint. At mole ratios above about 2.0, excess ammonium chloride is produced which must be subsequently removed.

The mixture is then heated at a sufficient temperature for a sufficient time to produce a reaction product the major portion of which is a silicon chloroimide. The heating temperature is preferably at least about 700° C., and most preferably from about 700° C. to about 1100° C. The heating or reaction time is dependent on the temperature.

Controlling the ammonia content of the starting gaseous mixture to the mole ratios given above and especially to the especially preferred ratio of about 1 insures that the ammonium chloride content of the reaction product is preferably no greater than about 30% by weight and therefore ammonium chloride removal steps are not needed. The by-product of this reaction is predominately HCl which is easy to scrub with caustic solution.

The resulting intermediate product has a bulk density of less than about 0.1 g/cc. If the bulk density of the intermediate is not increased, the subsequently produced silicon nitride will be essentially all fibrous or needle-like crystals with a high length to diameter ratio. If equiaxial silicon nitride crystals are desired in the final product, the bulk density is increased. If essentially all of the silicon nitride is to be equiaxial crystals, the bulk density is increased to greater than about 0.3 g/cc. If a mixture of fibrous and equiaxial silicon nitride is desired, the bulk density can be increased to a value between about 0.1 g/cc and about 0.3 g/cc. The closer the bulk density value is to 0.3 g/cc, the greater will be the amount of equiaxial crystals. Conversely, the closer the bulk density value is to 0.1 g/cc, the greater will be the amount of fibrous crystals in the subsequently produced silicon nitride.

The bulk density can be increased by conventional methods used to break up particles, so that in actuality, the long fibers of the intermediate are broken up and equiaxial crystals are then present with the amount of equiaxial crystals dependent on the particular method and conditions employed.

The bulk density can be increased by standard milling techniques.

The preferred method of increasing the bulk density is by compacting the intermediate product. This is most preferably done by pelletizing the product in a hydraulic press. The specific conditions as pressure, etc. depend on the desired bulk density. For example, the bulk density of the intermediate can be increased to from about 11.9 to about 14.6 times the value of uncompacted material by using a pressure of from barely perceptible on the gauge such as about 50 psi to about 30,000 pounds per square inch.

The increase in bulk density can be further enhanced by deaerating the intermediate produce prior to the compacting step. The advantage of deaerating is that the deaerated powder is flowable and not dusty and is therefore easier to handle. A preferred deaerating technique is to introduce the intermediate product powder into a two inch diameter pyrex tube with a fixed and a movable stopper to press the powder. The resulting deaerated powder can be compacted on a hand operated hydraulic press to about one-thirteenth of its original volume.

The intermediate product is then heated in a non-oxidizing atmosphere at a sufficient temperature for a sufficient time to produce the controlled crystal morphology silicon nitride. The preferred temperatures are from about 1350° C. to about 1550° C.

A non-oxidizing atmosphere is essential to insure that the chloroimide and the silicon nitride will not be oxidized. The preferred non-oxidizing atmospheres are hydrogen, nitrogen and mixtures thereof. When mixtures are used, the amounts of the constituents depend on the particular set of operating conditions.

The above described steps are carried out preferably as described below, However, it is to be understood that any suitable apparatus and/or procedure which supports the necessary reaction conditions can be used without departing from the scope of the invention.

An ammonia gas stream and a chlorosilane, preferably silicon tetrachloride gas stream are each preheated to the above given temperature range and mixed together at the top of a vertically oriented tube which is at a temperature of preferably about 1100° C. Preferably the furnace temperature and residence time (flow rate of the gases) are controlled so that the gas mixture reaches about 700° C. at about 50% to about 70% of the distance down the tube, causing the reaction to silicon chloroimide particles to occur. The reaction continues within the remainder of the furnace. The resulting intermediate product enters a settling tank and dust collector system that is under an atmosphere of nitrogen.

In the settling tank the temperature is controlled before collecting the reaction product so that some ammonium chloride is allowed to condense on and agglomerate the silicon chloroimide particles. The final reaction product contains typically from about 5% to about 50% by weight ammonium chloride. The ammonium chloride coating helps to improve product collection efficiency and gives the reaction product enhanced oxidation resistance.

The intermediate product is then processed to increase its bulk density by milling, or compaction or deaeration followed by compaction.

The resulting incresed bulk density intermediate product is then loaded into a furnace and heated or fired in non-oxidizing atmosphere at a sufficient temperature for a sufficient time to produce the silicon nitride To more fully illustrate this invention, the following non-limiting example is presented.

EXAMPLE

About 0.6 gallons per hour of liquid silicon tetrachloride is heated to about 300° C. and continuously mixed with about 20 scfh of anhydrous ammonia which is also heated at about 300° C. The mixture is fed into the top of a tube furnace which has been heated to about 1150° C. and which contains a 3" diameter quartz tube that is about 36" long. The product collected in the settling and dust collector contains about 75% by weight silicon chloroimide and about 25% by weight ammonium chloride.

The intermediate powder made by the above described method is found to have a bulk density of about 0.07 g/cc. When converted to silicon nitride, it has almost entirely needle-like (fibrous) morphology as shown in FIG. 1.

A sample of the above intermediate powder is hand pressed in a mechanical arbor press in a 6" ID die and ram to a bulk density of about 0.19 g/cc. This bulk density is about 2.7 times greater than that of the unpressed intermediate. The crystal morphology of the resulting silicon nitride is a mixture of fibers or needles and equiaxial particles as shown in FIG. 2.

Another sample of the intermediate is hydraulically pressed to about 15,000 psi in a 3" ID die and ram to a bulk density of about 0.41 g/cc. This is about a 5.9 fold increase in compaction of the intermediate. The resulting silicon nitride product has essentially fully equiaxial particles as shown in FIG. 3.

Figure 2:
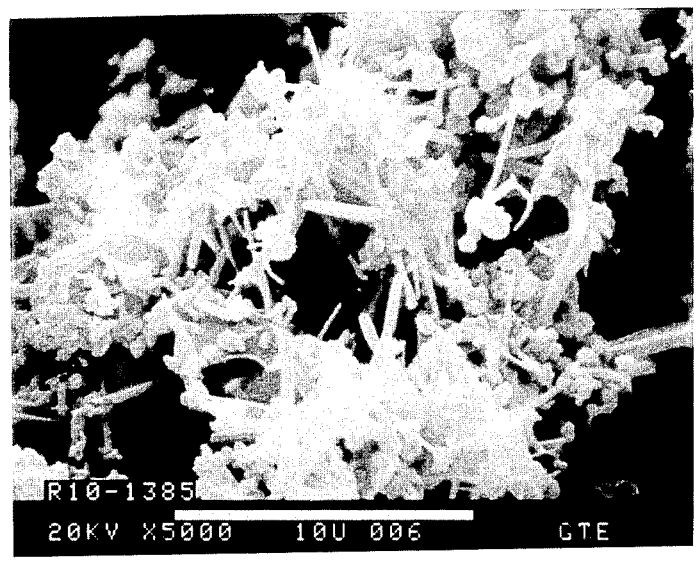
FIG. 2 is a photomicrograph of silicon nitride produced from an intermediate in which the bulk density is about 0.19 g/cc.
Figure 3:
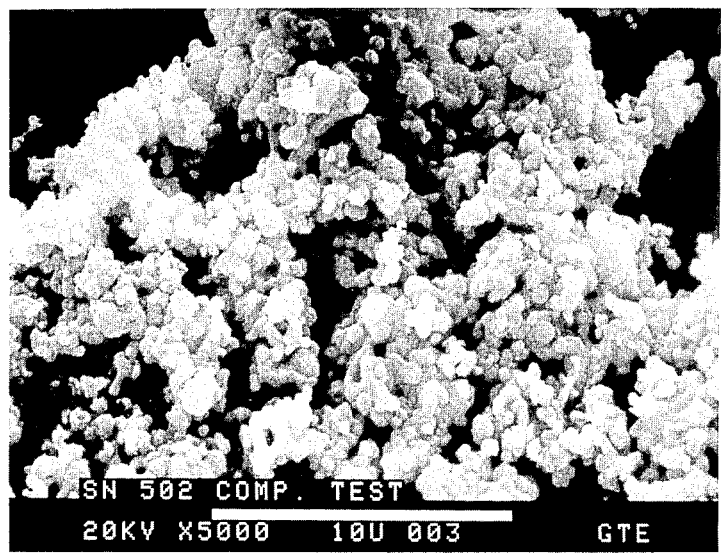
FIG. 3 is a photomicrograph of silicon nitride produced from an intermediate in which the bulk density is about 0.41 g/cc.

| Summary of the Data From the Above Example | | | |
| --- | --- | --- | --- |
| | Bulk Density g/cc | Compaction Factor | Morphology |
| FIG. 1 | 0.07 | 1 | essentially all needles |
| FIG. 2 | 0.19 | 2.7 | mixed needles and equiaxed |
| FIG. 3 | 0.41 | 5.9 | essentially all |

-continued

Summary of the Data From the Above Example

| Bulk Density g/cc | Compaction Factor | Morphology |
|---|---|---|
| | | equiaxed |

While there has been shown and described what are at present considered the preferred embodiments of the invention, it will be obvious to those skilled in the art that various changes and modifications may be made therein without departing from the scope of the invention as defined by the appended claims.

What is claimed is:

1. A method for producing silicon nitride wherein the crystal morphology of said silicon nitride is controlled, said method comprising:
    (a) heating a mixture consisting essentially of a chlorosilane and ammonia at a temperature of at least about 300° C. for a sufficient time to produce silicon chloroimide as an intermediate product;
    (b) commminuting said intermediate product by a comminuting method selected from the group consisting of milling, compacting and combinations thereof, to control the bulk density of said intermediate to greater than about 0.3 g/cc to result in said silicon nitride having a crystal morphology which is essentially all equiaxial, or comminuting said intermediate product by said comminuting methods to control the bulk density of said intermediate to between about 0.1 g/cc and about 0.3 g/cc to result in said silicon nitride having a crystal morphology which is a mixture of fibrous and equiaxial; and
    (c) heating the resulting intermediate product having controlled bulk density at a temperature of at least about 700° C. for a sufficient time in a non-oxidizing atmosphere to produce the controlled crystal morphology silicon nitride.

2. A method of claim 1 wherein said chlorosilane is silicon tetrachloride.

3. A method of claim 1 wherein said mixture is heated at from about 700° C. to about 1100° C.

4. A method of claim 1 wherein said non-oxidizing atmosphere is selected from the group consisting of hydrogen, nitrogen, and mixtures thereof.

5. A method for producing silicon nitride wherein the crystal morphology of said silicon nitride is controlled, said method comprising:
    (a) heating a mixture consisting essentially of a chlorosilane and ammonia at a temperature of at least about 300° C. for a efficient time to produce silicon chlorimide as an intermediate product;
    (b) comminuting said intermediate product by a comminuting method selected from the group consisting of milling, compacting, and combinations thereof, to control the bulk density of said intermediate to greater than about 0.1 g/cc to result in at least a portion of the crystal morphology of said silicon nitride being equiaxial; and
    (c) heating the resulting intermediate product having controlled bulk density at a temperature of at least about 700° C. for a sufficient time in a non-oxidizing atmosphere to produce the controlled crystal morphology silicon nitride.

6. A method of claim 5 wherein said chlorosilane is silicon tetrachloride.

7. A method of claim 5 wherein said mixture is heated at from about 700° C. to about 1100° C.

8. A method of claim 5 wherein said non-oxidizing atmosphere is selected from the group consisting of hydrogen, nitrogen, and mixtures thereof.

9. A method of claim 5 wherein said bulk density of said intermediate product is increased by compacting said intermediate product.

* * * * *